United States Patent  
Kim

(10) Patent No.: US 7,378,322 B2
(45) Date of Patent: May 27, 2008

(54) SEMICONDUCTOR DEVICE HAVING NON-UNIFORMLY THICK GATE OXIDE LAYER FOR IMPROVING REFRESH CHARACTERISTICS

(75) Inventor: Bo Youn Kim, Kyoungki-do (KR)

(73) Assignee: Hynix Semiconductor Inc., Kyoungki-do (KR)

(*) Notice: Subject to any disclaimer, the term of this patent is extended or adjusted under 35 U.S.C. 154(b) by 411 days.

(21) Appl. No.: 11/287,598

(22) Filed: Nov. 28, 2005

(65) Prior Publication Data

US 2006/0270167 A1 Nov. 30, 2006

(30) Foreign Application Priority Data

May 27, 2005 (KR) .................. 10-2005-0045074

(51) Int. Cl.
*H01L 21/336* (2006.01)
(52) U.S. Cl. .................. 438/287; 438/591; 257/E21.625

(58) Field of Classification Search .............. 438/287, 438/591; 257/E21.621, E21.624, E21.625, 257/E21.635, E21.638
See application file for complete search history.

(56) References Cited

U.S. PATENT DOCUMENTS 5,661,048 A * 8/1997 Davies et al. .............. 438/217
6,743,688 B1 * 6/2004 Gardner et al. ............ 438/287

* cited by examiner

*Primary Examiner*—Chandra Chaudhari
(74) *Attorney, Agent, or Firm*—Ladas & Parry LLP

(57) ABSTRACT

To improve the refresh characteristics of a semiconductor device, a gate oxide layer comprising a first oxide layer and a second oxide layer are formed on the substrate. A portion of the second oxide layer is isotropically etched using a photoresist layer pattern. A gate is formed by sequentially forming a gate conductive layer and a hard mask layer on the second oxide layer, and sequentially etching the hard mask layer, the gate conductive layer, the second oxide layer and the first oxide layer. Due to isotropic etching of the second oxide layer, the portion of the gate oxide layer corresponding to the center portion of the channel gate is thinner than the other portion of the gate oxide layer correspond to an edge of the channel gate.

8 Claims, 3 Drawing Sheets

SEMICONDUCTOR DEVICE HAVING NON-UNIFORMLY THICK GATE OXIDE LAYER FOR IMPROVING REFRESH CHARACTERISTICS

BACKGROUND OF THE INVENTION

1. Field of the Invention

The present invention relates generally to a method of manufacturing a semiconductor device. More particularly, the present invention relates to a method of forming a gate capable of improving refresh characteristics.

2. Description of the Prior Art

In general, a gate insulating layer of a MOSFET device is made from a silicon oxide layer (hereinafter, referred to as a $SiO_2$ layer) obtained through terminal oxidation. As semiconductor devices have become highly integrated, the thickness of the gate oxide layer has been gradually reduced, but the density of impurities implanted into a channel and a source/drain junction area has gradually increased. Accordingly, the direct tunneling and boron penetration phenomenon may occur through the gate oxide layer having the reduced thickness and the leakage current of the semiconductor device may increase.

In particular, the leakage current of the semiconductor device mainly occurs at an edge portion of the channel subject to a high electric field, that is, at an overlap area between the gate and the source/drain junction area. If the leakage current of the semiconductor device increases, the refresh time for the semiconductor device is reduced.

Hereinafter, a conventional method of manufacturing a semiconductor device and problems thereof will be described with reference to FIG. 1.

Referring to FIG. 1, a gate oxide layer 3, a polysilicon layer 4, a metal silicide layer 5 and a hard mask layer 6 are sequentially formed on a semiconductor substrate 1 having an isolation layer 2 for defining an active area. Then, a gate 7 is formed by patterning the above layers 6, 5, 4 and 3. After that, spacers 8 are formed at both sidewalls of the gate 7. Then, a source/drain area 9 is formed on either side of the gate 7 (shown with dotted lines in FIG. 1) on an upper surface of the semiconductor substrate 1 corresponding to the spacers 8 formed at the sidewalls of the gate 7, thereby obtaining a transistor.

According to the above conventional method, the gate oxide layer 3 has a uniform thickness. Thus, if the thickness of the gate oxide layer 3 is reduced in order to improve the dielectric constant of the gate oxide layer 3 corresponding to the high integration of the semiconductor device, current leakage, such as gate induced drain leakage (GIDL), may occur at the edge portion of the channel, that is, at the overlap area between the gate oxide layer and the source/drain area, so that the refresh time of the semiconductor device is reduced.

SUMMARY OF THE INVENTION

Accordingly, the present invention has been made to solve the above-mentioned problems occurring in the prior art, and an object of the present invention is to provide a method of manufacturing a semiconductor device capable of restricting the GIDL phenomenon at an edge portion of a channel.

Another object of the present invention is to provide a method of manufacturing a semiconductor device capable of improving refresh characteristics of the semiconductor device by restricting the GIDL phenomenon at an edge portion of a channel.

In order to accomplish the above objects, the present invention provides a method of manufacturing a semiconductor device, the method comprising the steps of: forming a first oxide layer on a semiconductor substrate having an isolation layer for defining an active area; depositing a second oxide layer on the first oxide layer; forming a photoresist layer pattern on the second oxide layer to expose a gate area; performing an isotropic etching process with respect to the exposed second oxide layer such that an under-cut portion is formed in the second oxide layer; removing the photoresist layer pattern; sequentially forming a gate conductive layer and a hard mask layer on the second oxide layer which has undergone the isotropic etching process; and sequentially etching the hard mask layer, the gate conductive layer, the second oxide layer and the first oxide layer, thereby forming a gate having a gate oxide layer consisting of the first and second oxide layers, wherein a center portion of the gate oxide layer has a thickness smaller than that of an edge portion of the gate oxide layer.

According to the preferred embodiment of the present invention, the first oxide layer is formed through an oxidation process, and the second oxide layer is formed through a deposition process.

After removing the photoresist layer pattern and before depositing the gate conductive layer, a re-oxidation process is carried out in order to compensate for defects created when the isotropic etching process is performed with respect to the second oxide layer.

A third oxide layer is formed on the second oxide layer, which has undergone the isotropic etching process, as a result of the re-oxidation process.

The gate conductive layer is a stacked layer consisting of a polysilicon layer and a metal silicide layer, or a polysilicon layer and a metal layer.

The gate conductive layer is formed through performing the processes of depositing the polysilicon layer, planarizing the polysilicon layer and deposition the metal silicide layer or the metal layer on the polysilicon layer.

The first oxide layer is formed through a thermal oxidation process at a temperature of 750~900° C. and under an atmosphere including $O_2$, $O_2+N_2$, or $H_2O$.

The second oxide layer is formed by depositing TEOS-based or HTO-based material below the atmospheric pressure.

The third oxide layer is formed under the same condition in which the first oxide layer is formed.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, the present invention will be described with reference to accompanying drawings.

FIGS. 2A to 2E are cross-sectional views illustrating the procedure for manufacturing a semiconductor device according to one embodiment of the present invention.

Figure 1:
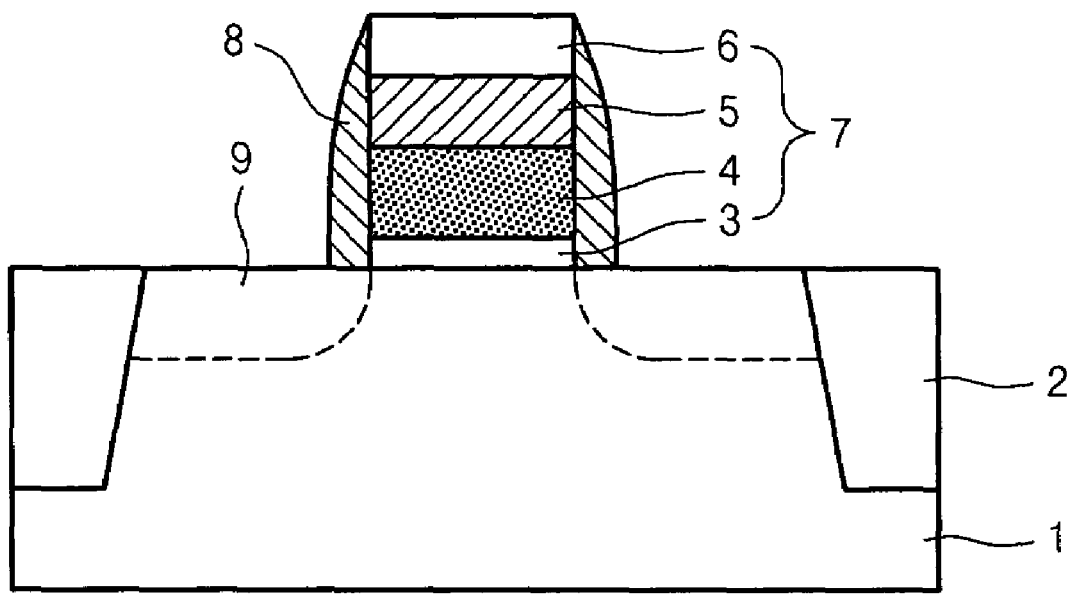
FIG. 1 is a cross-sectional view for explaining a conventional method of manufacturing a semiconductor device.
Figure 2A:
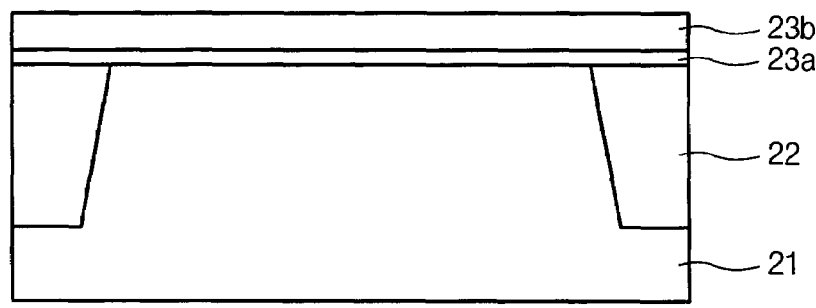
FIGS. 2A to 2E are cross-sectional views illustrating the procedure for manufacturing a semiconductor device according to one embodiment of the present invention.

Referring to FIG. 2A, a first oxide layer 23a is formed on a semiconductor substrate 21 having an isolation layer 22, which defines an active area, and a well (not shown). The first oxide layer 23a is formed as a conventional gate oxide material through a thermal oxidation process at a temperature of 750~900° C. and under an atmosphere including $O_2$, $O_2+N_2$, or $H_2O$. After that, a second oxide layer 23b is deposited on the first oxide layer 23a through a deposition process. The second oxide layer 23b is formed by depositing TEOS-based or HTO-based material below the atmospheric pressure.

Figure 2B:
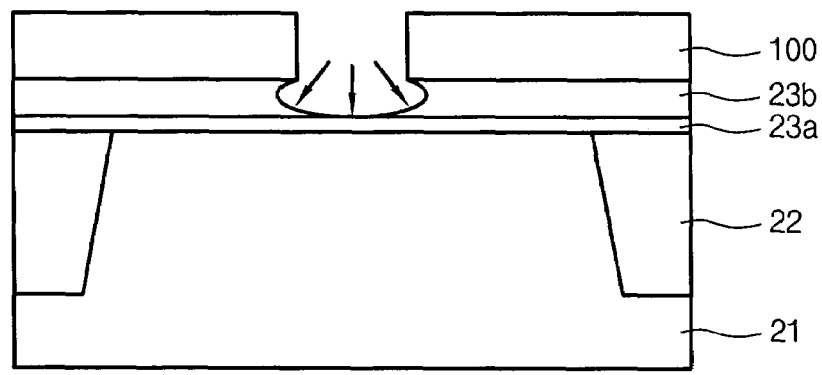

Referring to FIG. 2B, a photoresist layer pattern 100 having an opening for exposing a gate area is formed on the second oxide layer 23b. Then, an isotropic etching process is performed with respect to the second oxide layer 23b by using the photoresist layer pattern 100 as an etching barrier such that an under-cut part is formed in the second oxide layer 23b. As a result, the total thickness of the oxide layers 23a, 23b is thinner at the etched portion corresponding to the center portion of the gate than the thickness of the oxide layers 23a, 23b corresponding to the other portions such as near the edges of the gate.

Figure 2C:
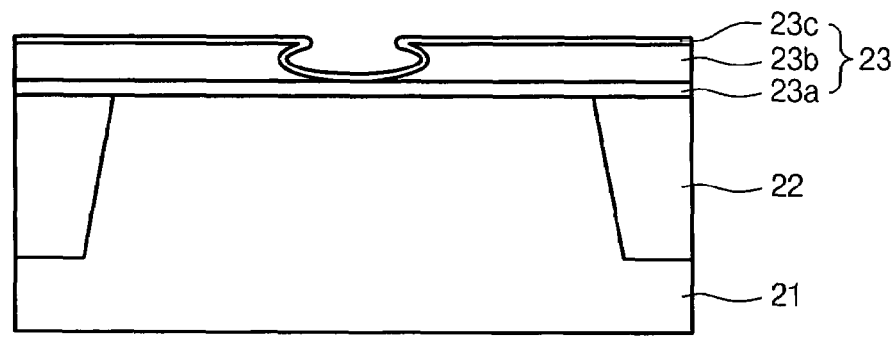

Referring to FIG. 2C, after removing the photoresist layer pattern 100, a re-oxidation process is performed with respect to the resultant substrate so as to compensate for the defects that may have been created when the isotropic etching process is performed with respect to the second oxide layer 23b. As a result, a third oxide layer 23c is formed on the isotropically etched second oxide layer 23b. The third oxide layer 23c is formed under same condition in which the first oxide layer 23a is formed. Therefore, the gate oxide layer 23 according to the present invention is a stacked layer comprising the first oxide layer 23a, the isotropically etched second oxide layer 23b, and the third oxide layer 23c. Due to the isotropic etching of the second oxide layer 23b, the thickness of the center portion of the oxide layer 23 is thinner than the thickness of the other parts of the oxide layer 23 including the portions of the oxider 23 corresponding to the edge portions of the channel of a gate to be formed layer (such as the gate 27 shown in FIG. 2E).

Hence, the gate oxide layer 23 according to the present invention represents a relatively higher dielectric constant at the center portion of the channel and a relatively lower dielectric constant at the edge portion of the channel. Accordingly, it is possible to obtain a transistor, in which a gate of the transistor represents the superior control function at a center portion of a channel and the GIDL phenomenon is restricted at an edge portion of the channel. Therefore, the semiconductor device manufactured according to the method of the present invention lengthens the refresh time as compared with that of the conventional semiconductor device having a uniformly thick gate oxide layer. Accordingly, the present invention can stabilize the operational characteristics of the semiconductor device.

Figure 2D:
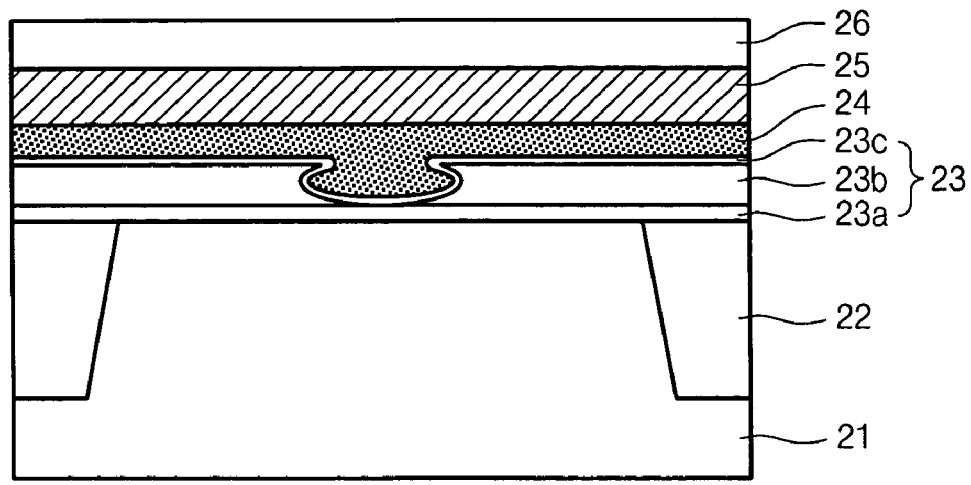

Referring to FIG. 2D, a polysilicon layer 24 is formed on the third oxide layer 23c as a gate conductive layer. Then, a chemical mechanical polishing (CMP) process is performed with respect to the polysilicon layer 24, thereby planarizing the polysilicon layer 24. After that, a tungsten silicide layer 25 and a hard mask nitride layer 26 are sequentially formed on the planarized polysilicon layer 24.

According to one embodiment of the present invention, the tungsten silicide layer 25 is formed on the polysilicon layer 24 in order to realize low resistance of the gate. However, according to another embodiment of the present invention, a metal silicide layer or a metal layer can be formed on the polysilicon layer 24, instead of the tungsten silicide layer 25. In addition, it is preferred to form an anti-reflection layer (not shown) on the hard mask nitride layer 26 in order to precisely perform the exposure process.

Figure 2E:
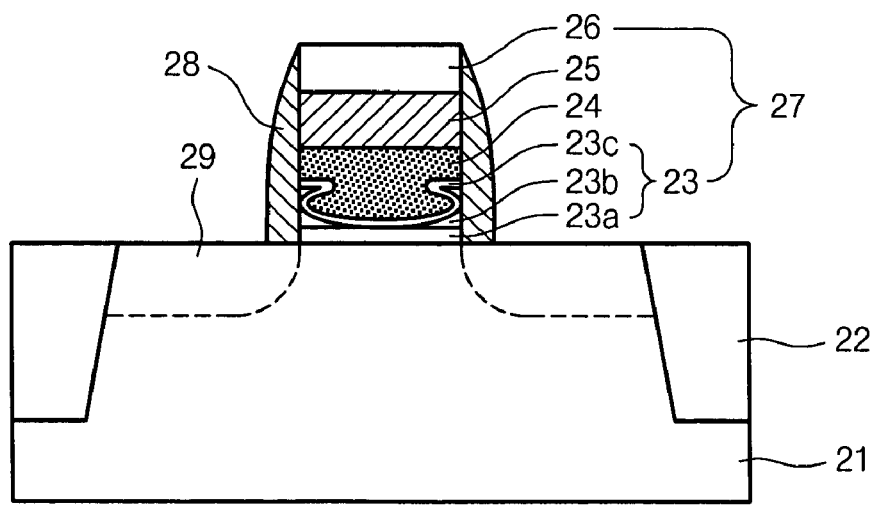

Referring to FIG. 2E, a gate area is defined by patterning the hard mask nitride layer 26 through conventional processes generally known in the art. Then, the tungsten silicide layer 25, the polysilicon layer 24 and the oxide layers 23a, 23b, and 23c are sequentially etched by using the patterned hard mask nitride layer 26 as an etching barrier, thereby forming a gate 27 having the gate oxide layer 23, in which the portion of the gate oxide layer 23 corresponding to the center portion of the channel of the gate 27 is thinner than the other portions of the gate oxide layer 23 including the portions corresponding the edge portions of the channel of the gate 27.

After that, spacers 28 are formed at both sidewalls of the gate 27. Then, a source/drain area 29 is formed on either side of the gate 27 on the upper surface of the semiconductor substrate 21 corresponding to the spacers 28 formed at the sidewalls of the gate 27 by performing a source/drain ion implantation process, thereby obtaining the transistor.

Thereafter, although it is not illustrated in figures, next fabrication processes are sequentially performed, thereby fabricating the semiconductor device according to the present invention.

As described above, according to the present invention, the gate having the gate oxide layer, in which the portion of the gate oxide layer corresponding to the center portion of the gate channel is thinner than the other portions of the gate oxide layer including the portions corresponding to the the edges of the gate channel, is formed through an isotropic etching process, so that it is possible to obtain the transistor, in which the gate of the transistor represents the superior control function at the center portion of the channel and the GIDL phenomenon is restricted at the edge portions of the channel. Therefore, the transistor manufactured through the method according to the present invention may lengthen the refresh time and stabilize the operational characteristics thereof as compared with those of the conventional transistor having a gate oxide layer with a uniform thickness.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method of manufacturing a semiconductor device having a silicon substrate having an active area defined by isolation layers, the method comprising the steps of:
   i) forming a gate oxide layer comprising a first oxide layer formed on the active area of semiconductor substrate and a second oxide layer formed on the first oxide layer;
   ii) forming a photoresist layer having a hole on the second oxide layer to expose a gate area;
   iii) isotropically etching the second oxide layer exposed by the hole such that an under-cut portion being larger than the area of the hole is formed in the second oxide layer below the photoresist layer;
   iv) removing the photoresist layer;
   v) sequentially forming a gate conductive layer and a hard mask layer on the isotropically etched second oxide layer; and
   vi) sequentially etching the hard mask layer, the gate conductive layer, all layers of the gate oxide layer including at least the isotropically etched second oxide layer wherein the isotropically etched portion of the second oxide layer corresponds to the center portion of a channel area of the gate such that the thickness of the gate oxide layer corresponding to the center portion of the gate channel area is thinner than the thickness of the gate oxide layer corresponding to an edge portion of the gate channel area.

2. The method as claimed in claim 1, wherein the first oxide layer is formed through an oxidation process, and the second oxide layer is formed through a deposition process.

3. The method as claimed in claim 1, further comprising a step of performing a re-oxidation process after step iv) and before step v) thereby forming a third oxide layer on the isotropically etched second oxide layer to compensate for defects created when the isotropic etching process is performed with respect to the second oxide layer such that the gate oxide layer further comprises the third oxide layer.

4. The method as claimed in claim 1, wherein the gate conductive layer is a stacked layer of either (1) a polysilicon layer and a metal silicide layer or (2) a polysilicon layer and a metal layer.

5. The method as claimed in claim 4, wherein the gate conductive layer is formed by:

depositing the polysilicon layer;

planarizing the polysilicon layer; and depositing the metal silicide layer or the metal layer on the polysilicon layer.

6. The method as claimed in claim 2, wherein the first oxide layer is formed through a thermal oxidation process at a temperature of 750~900° C. and under an atmosphere including $O_2$, $O_2+N_2$, or $H_2O$.

7. The method as claimed in claim 2, wherein the second oxide layer is formed by depositing TEOS-based or HTO-based material below the atmospheric pressure.

8. The method as claimed in claim 3, wherein the third oxide layer is formed under the same condition in which the first oxide layer is formed.

* * * * *